(12) United States Patent　　(10) Patent No.: US 7,615,791 B2
Hashimoto　　(45) Date of Patent: Nov. 10, 2009

(54) SEMICONDUCTOR OPTICAL DEVICE

(75) Inventor: Jun-ichi Hashimoto, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 395 days.

(21) Appl. No.: 11/363,264

(22) Filed: Feb. 28, 2006

(65) Prior Publication Data

US 2006/0202212 A1　Sep. 14, 2006

(30) Foreign Application Priority Data

Mar. 1, 2005　(JP) ............................ P2005-056520

(51) Int. Cl.
　　*H01L 33/00*　(2006.01)
(52) U.S. Cl. .................. 257/80; 257/E33.077; 359/344
(58) Field of Classification Search .................. 257/80, 257/E33.077; 359/344
See application file for complete search history.

(56) References Cited

U.S. PATENT DOCUMENTS

| | | | |
|---|---|---|---|
| 5,025,450 A * | 6/1991 | Aoyagi et al. ............ | 372/46.01 |
| 6,671,086 B1 * | 12/2003 | Wang et al. ............... | 359/344 |
| 2002/0067541 A1 * | 6/2002 | Morito ...................... | 359/344 |
| 2004/0196541 A1 * | 10/2004 | Darling et al. ............. | 359/344 |
| 2004/0218642 A1 * | 11/2004 | Kawanishi .................. | 372/28 |

FOREIGN PATENT DOCUMENTS

| | | |
|---|---|---|
| JP | 59-129473 | 7/1984 |
| JP | 10-154841 | 6/1998 |

OTHER PUBLICATIONS

"Extremely low operating current SOA gate for WDM applications",T. Ito e al., OECC' 97 Technical Digest, Jul. 1997, Seoul Korea, PDP1-1, pp. 2-3.
Japanese Office Action issued on Jul. 14, 2009 for Japanese Patent Application No. 2005-056520 with English translation.

* cited by examiner

*Primary Examiner*—Sue Purvis
*Assistant Examiner*—Krista Soderholm
(74) *Attorney, Agent, or Firm*—Smith, Gambrell & Russell, LLP

(57) ABSTRACT

A semiconductor optical device comprises a lower cladding layer of a first conductive type, an upper cladding layer of a second conductive type, and an active layer. The lower cladding layer has a first region and a second region. The first region extends in a direction of a predetermined axis, and the second region is located adjacent to the first region. The active layer is provided between the first region of the lower cladding layer and the upper cladding layer. The thickness of the active layer is changed in the direction such that TM mode gain and TE mode gain are substantially equal to each other.

21 Claims, 6 Drawing Sheets

(b)

(a)

(a)

(b)

SEMICONDUCTOR OPTICAL DEVICE

BACKGROUND OF THE INVENTION

1. Field of the Invention

The present invention relates to a semiconductor optical device.

2. Related Background of the Invention

One type of conventional semiconductor optical devices includes an active layer having a bulk structure, and the active layer is provided between the upper cladding layer and the lower cladding layer. This type encompasses semiconductor optical amplifiers, and in order to reduce the dependence of amplification characteristics thereof on polarization direction, the semiconductor optical amplifier includes a mesa-shaped active layer and the cross section of the active layer, taken along a plane intersecting with the light guiding direction in which light in the active layer propagates, is square. Publication (T. Ito et al. OECC' 97, PDP101, pp 2-3, 1997) discloses such a semiconductor optical amplifier.

SUMMARY OF THE INVENTION

In most cases, the active layer of the above semiconductor optical amplifier is formed into a mesa shape by wet etching because its processing damages to the active layer are small.

However, because of isotropic etching characteristics of wet etching, the active layer of the semiconductor optical amplifier is side-etched, and thus it is difficult to form the active layer of a square cross section. Consequently, the difference between optical confinement factors for the TE mode and TM mode becomes large, so that the dependence of amplification characteristics on polarization cannot be reduced. In order to suppress the generation of higher propagating modes and at the same time obtain amplification characteristics having less dependence on polarization direction, the bulk active layer should be processed to form the narrow width of about 0.5 micrometers in its square cross section with its processing accuracy of −0.1 to +0.1 micrometers as shown in Japanese paten laid open publication No. 2000-244074. However, when wet etching is used for the processing, etching rates are changed for each fabrication by slight changes in temperature, concentration and mixture of etchant, and so on, and they are also changed in each area of the wafer due to the differences of stirring speed of the etchant in each area of the wafer. Therefore, with wet etching, it is difficult to perform the precise etching of the active layer mentioned above with a high reproducibility and uniformity.

It is an object of the present invention to provide an semiconductor optical device that reduces the dependence of its amplification characteristics on polarization direction and facilitates its fabrication.

According to one aspect of the present invention, a semiconductor optical device comprises: a lower cladding layer of a first conductive type, the lower cladding layer having a first region and a second region, the first region extending in a light propagating direction, and the second region being adjacent to the first region; an upper cladding layer of a second conductive type; and an active layer provided between the first region of the lower cladding layer and the upper cladding layer, a thickness of the active layer being changed in the light propagating direction such that TM mode gain and TE mode gain are substantially equal to each other.

In the semiconductor optical device according to the present invention, the active layer may have a tensile strain. In the semiconductor optical device according to the present invention, the active layer may have compressive strain.

In the semiconductor optical device according to the present invention, the active layer may have a portion having a width changed in the propagating direction. Furthermore, in the semiconductor optical device according to the present invention, the active layer may include first and second portions, and a width of the second portion of the active layer may be increased in the propagating direction.

In the semiconductor optical device according to the present invention, the active layer may include first and second portions, and a thickness of the second portion of the active layer may be increased in the propagating direction such that TM mode gain and TE mode gain are substantially equal to each other. In the semiconductor optical device according to the present invention, the active layer may include first to third portions, and a thickness of the second portion of the active layer is increased in the propagating direction such that TM mode gain and TE mode gain are substantially equal to each other.

In the preferable semiconductor optical device according to the present invention, the upper cladding layer is provided on the second region of the lower cladding layer and the active layer. The upper cladding layer and the second region of the lower cladding layer forms a pn junction, and the active layer, the upper cladding layer and the first region of the lower cladding layer forms a pin junction, and a built-in potential of the pin junction is smaller than that of the pn junction.

In the semiconductor optical device according to the present invention, the active layer has a bulk structure. Alternatively, in the semiconductor optical device according to the present invention, the active layer has a quantum well structure.

In the semiconductor optical device according to the present invention, the semiconductor optical device includes a semiconductor laser. In the semiconductor optical device according to the present invention, the semiconductor optical device includes a light emitting diode. In the semiconductor optical device according to the present invention, the semiconductor optical device includes a semiconductor optical amplifier. In the semiconductor optical device according to the present invention, the semiconductor optical device includes an electro-absorption type modulator. In the semiconductor optical device according to the present invention, the semiconductor optical device includes a semiconductor optical waveguide. In the semiconductor optical device according to the present invention, the semiconductor optical device includes a Mach-Zehnder type optical modulator.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

DESCRIPTION OF THE PREFERRED EMBODIMENTS

The teachings of the present invention will readily be understood in view of the following detailed description with reference to the accompanying drawings illustrated by way of example. When possible, parts identical to each other will be referred to with reference symbols identical to each other.

First Embodiment

Figure 1:
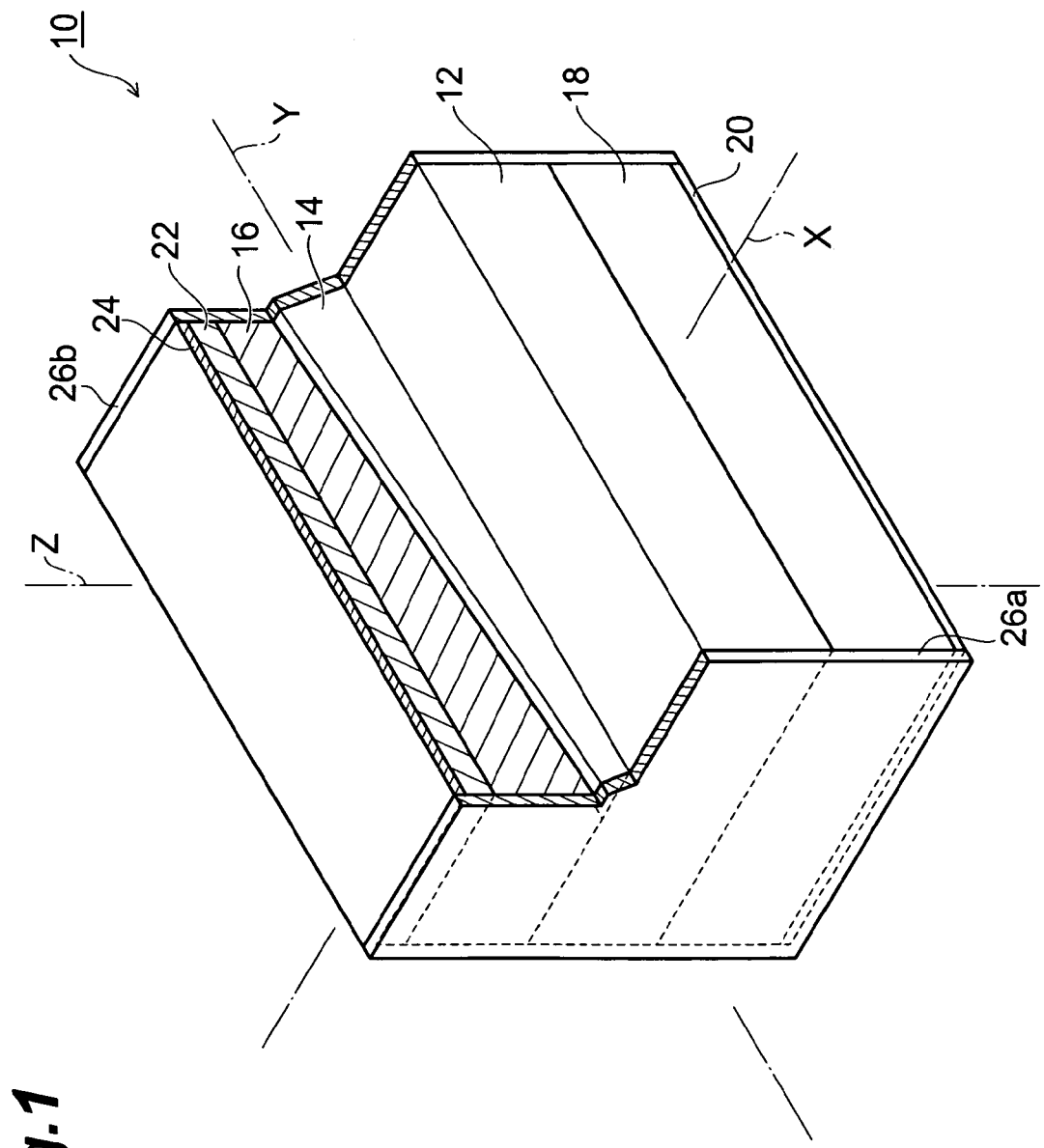
FIG. 1 is a perspective view partly in section showing a semiconductor optical amplifier according to the first embodiment of the present invention.
Figure 2:
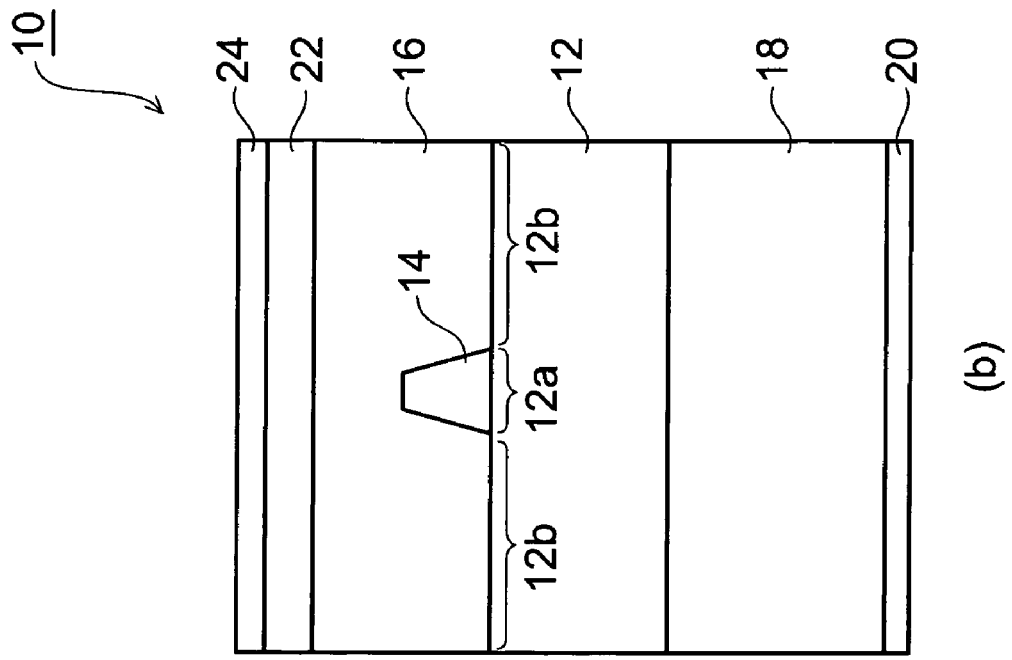
FIG. 2 is a view showing the semiconductor optical amplifier according to the first embodiment of the present invention.
Figure 2:
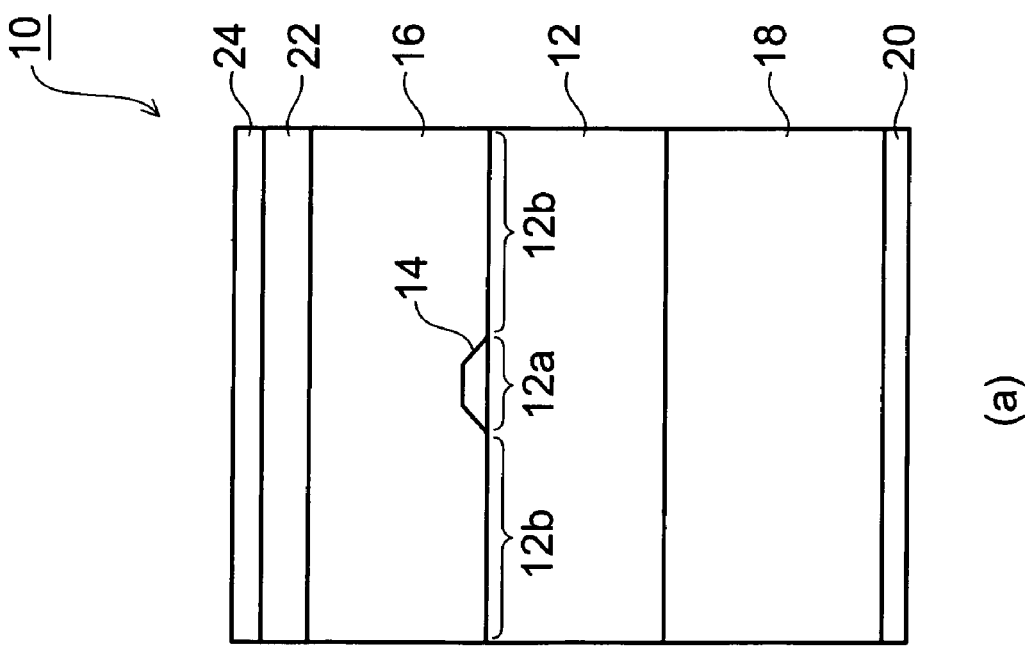

FIG. 1 is a perspective view partly in section showing a semiconductor optical amplifier according to the first embodiment of the present invention. FIG. 2 is a view showing the semiconductor optical amplifier according to the first embodiment of the present invention. Part (a) of FIG. 2 shows one facet of the semiconductor optical amplifier on which an anti-reflection coating has not been formed yet, and part (b) of FIG. 2 shows the other facet of the semiconductor optical amplifier, on which an anti-reflection coating has not been formed yet.

A semiconductor optical amplifier 10 comprises a lower cladding layer 12 of the first conductive type, an active layer 14 and an upper cladding layer 16 of the second conductive type.

The lower cladding layer 12 is, for example, an n-type cladding layer. The lower cladding layer 12 is provided on the primary surface of a semiconductor substrate 18 of the first conductive type. On the other surface, a backside electrode 20 is made of AuGeNi, for example. N-type GaAs substrates can be used as the semiconductor substrate 18. The semiconductor substrate 18 is heavily doped with dopant of the same conductivity as that of the lower cladding layer 12 by which an ohmic contact is formed at the interface between the substrate 18 and electrode 20.

The lower cladding layer 12 is made of GaInP, GaInAsP, AlGaAs or AlGaInP. The lower cladding layer 12 is doped with n-type dopant, such as silicon (Si).

The lower cladding layer 12 includes a first region 12a and second regions 12b. The first region 12a extend in a direction, for example the Y-direction in FIG. 1, in which light is optically guided in the active layer 14. The second regions 12b are provided in both sides of the first region 12a. In this embodiment, the width of the first region 12a, which is defined as, for example, the length taken in the X direction in FIG. 1, is constant.

On the first region 12a, the active layer 14 is provided. The active layer 14 in the present embodiment has a bulk structure and is made of strain-free material, i.e., material lattice-matched to that of the semiconductor substrate 18. The active layer 14 is made, for example, of GaInNAs or GaAs. Preferably, the active layer 14 is made of binary compound crystal, such as GaAs. There is no fluctuation in the composition of the active layer 14 of binary compound crystal that is caused during its growth, thereby making the crystal growth control easy.

The upper cladding layer 16 is, for example, a p-type cladding layer. The upper cladding layer 16 is provided on the second region 12b and the active layer 14.

The upper cladding layer 16 is made of GaInP, GaInAsP, AlGaAs or AlGaInP. The upper cladding layer 16 is doped with p-type dopant, such as zinc (Zn) or carbon (C).

The whole of the lower cladding layer 12 and the upper cladding layer 16 can be made of material that does not contain any aluminum constituent, such as GaInP or GaInAsP, or the lower cladding layer 12 and the upper cladding layer 16 have regions that contact with the active layer 14, and the relevant regions can be made of the material that does not includes aluminum, such as GaInP or GaInAsP.

When the material that does not includes aluminum is used for the whole or the parts of the lower cladding layer 12 and upper cladding layer 16, the oxidization of these cladding layers 12 and 16 due to aluminum oxidation can be suppressed. This makes it possible to grow an active layer 14 on the lower cladding layer 12 with a good crystalline quality. Furthermore, for the same reason, the upper cladding layer 16 can be grown on the active layer 14 and a contact layer 22 can be grown on the upper cladding layer 16 with an excellent crystalline quality. Similarly, since the oxidization of the lower cladding layer 12 and upper cladding layer 16 can be prevented, the generation of crystal defects caused by the oxidization at the interface between the cladding layers and the active layer can be well suppressed. This results in the improvements of the yield, device performance and reliability of the semiconductor optical amplifier 10.

The contact layer 22 is provided on the upper cladding layer 16. On this contact layer 22, an upper electrode 24 is provided. The upper electrode 24 is made of TiPtAu. The contact layer 22 includes GaAs, for example. The contact layer 22 is heavily doped with dopant of the same conductive type as that of the upper cladding layer 16 by which an ohmic contact can be formed at the interface between the contact layer 22 and the upper electrode 24.

On one facet and another facet that are provided in the light propagating direction, antireflection coatings 26a and 26b are provided. The antireflection coatings 26a and 26b can suppress lasing oscillation of the semiconductor optical device 10 by decreasing optical reflection thereat, thereby permitting the semiconductor optical device 10 to operate as a semiconductor optical amplifier. The antireflection coatings 26a and 26b are made of SiN, for example.

The semiconductor optical amplifier 10 includes a pin junction that is constituted by the first region 12a of the lower cladding layer 12, the active layer 14 and the upper cladding layer 16. The turn-on voltage of this pin junction is determined by the built-in potential of the pin junction. The built-in potential of the pin junction is mainly determined by the bandgap energy of the active layer 14.

The semiconductor optical amplifier 10 includes a pn junction that is constituted by the lower cladding layer 12 and the upper cladding layer 16, and this pn junction is located on the both sides of the pin junction. The turn-on voltage of this pn junction is determined by the built-in potential of the pn junction. The built-in potential of the pn junction is mainly determined by the bandgap energies of the lower cladding layer 12 and the upper cladding layer 16.

In the semiconductor optical amplifier 10, since the bandgap energies of the lower cladding layer 12 and the upper cladding layer 16 are larger than the bandgap energy of the active layer 14, the built-in potential of the pn junction is larger than that of the pin junction. The semiconductor optical amplifier 10 confines current (carriers) into the pin junction by making use of the built-in potential difference between the pn and pin junctions.

That is, when the applied voltage is greater than the turn-on voltage of the pin junction and is smaller than that of the pn junction, it turns on the pin junction and lowers resistance in the turned-on pin junction, while it does not turn on the pn junction and therefore the resistance in the turned-off pn junction still remains high. This permits the current confinement into the pin junction, i.e., the active layer, and effective injection of current into the active layer 14.

The semiconductor optical amplifier 10 does not need the formation of any current blocking layer. The pn junction and pin junction are formed in two crystal growth steps: growing the active layer 14 on the lower cladding layer 12; growing the upper cladding layer 16 on the active layer 14. In the conventional buried heterostructure (BH) semiconductor optical amplifiers, an additional crystal growth step (three steps in total) for forming a current blocking layer is needed and it is difficult to form a current blocking layer of the thickness gradually changed according to the thickness change of the active layer 14 in the propagating direction which is needed in this device structure. Consequently, in the semiconductor optical amplifier 10 a higher yield, a higher reproducibility, a high uniformity and a lower cost in the fabrication can be realized than the conventional buried heterostructure (BH) semiconductor optical amplifiers.

In the semiconductor optical amplifier 10, the thickness of the active layer 14, which is defined as the length taken in the Z direction in FIG. 1, is changed in the propagating direction (the Y direction). In the present embodiment, the thickness of the active layer 14 is increased in the light propagating direction from the one facet toward the other facet. The width of the active layer 14, which is defined as length taken in the X direction, is substantially constant. In the active layer, the width is larger than the thickness at the one facet as shown in part (a) of FIG. 2, while the thickness is larger than the width at the other facet as shown in part (b) of FIG. 2.

The gains $G_{TE}$ and $G_{TM}$ for TE and TM modes of the semiconductor optical amplifier 10 are presented as the following equations (1) and (2):

$$G_{TE}=\exp\{\int_0^L [\Gamma_{TE}(y) g_{TE}(y)] dy\} \quad (1)$$

$$G_{TM}=\exp\{\int_0^L [\Gamma_{TM}(y) g_{TM}(y)] dy\} \quad (2)$$

where the symbol "L" indicates the length of the semiconductor optical amplifier 10, taken in the light propagating direction, and y=0 and L correspond to the position of the one facet and the other facet, respectively. Symbols $\Gamma_{TE}(y)$ and $\Gamma_{TM}(y)$ indicate optical confinement factors for the TE and TM modes at a point "y" in the semiconductor optical amplifier 10, respectively, and symbols $g_{TE}(y)$ and $g_{TM}(y)$ indicate material gain coefficients for the TE and TM modes at a point y determined by the material property of the active layer 14 in the semiconductor optical amplifier 10, respectively. As seen from the above equations, the total gain for each mode is determined by integrating the local mode gain coefficient, determined by the product of the optical confinement factor and material gain coefficient at each y point in a range from the one facet (y=0) to the other facet (y=L). Therefore, if the above integration value for the TM mode is equal to the integration value for the TE mode, the gains for both modes can be made equal to each other.

In the present embodiment, since the active layer is a strain-free bulk layer, the material gain coefficients for the TE and TM modes are equal to each other and the relationship between these material gain coefficients is expressed by the following equation (3).

$$g_{TE}(y)=g_{TM}(y) \quad (3)$$

To the contrary, since the thickness is varied in the light propagating direction, the optical confinement factors for the TE and TM modes are different from each other, and the relationship between these optical confinement factors is expressed by the following equation (4).

$$\Gamma_{TE}(y) \neq \Gamma_{TM}(y) \quad (4)$$

In the active layer 14, specifically, its width is constant, but its thickness is increased in a direction from the one facet toward the other facet. Accordingly, the width is larger than the thickness around the one facet as shown in part (a) of FIG. 2, the width is equal to the thickness at somewhere on the way to the other facet and the thickness is larger than the width around the other facet as shown in part (b) of FIG. 2. Therefore, the relationship, $\Gamma_{TE}(y)>\Gamma_{TM}(y)$, is satisfied around the one facet; the value $\Gamma_{TM}(y)$ is close to $\Gamma_{TE}(y)$ on the way to the other facet; the relationship, $\Gamma_{TE}(y)<\Gamma_{TM}(y)$, is satisfied around the other facet. Therefore, considering that a local mode gain coefficient is determined by the product of the corresponding optical confinement factor and a material gain coefficient, as mentioned above, it is known that the TE mode gain coefficient is larger than the TM mode gain coefficient around the one facet, but the difference between the gain coefficients for TE and TM modes is reduced as signal light propagates toward the other facet, and the TM mode gain coefficient is larger than the TE mode gain coefficient around the other facet.

Therefore, if the thickness of the active layer is appropriately varied in the light propagating direction, excess of the local TE mode gain coefficient over the local TM mode gain coefficient in the former part of the active layer around the one facet is cancelled out by excess of the local TM mode gain coefficient over the local TE mode gain coefficient in the remaining part of the active layer around the other facet, whereby the integration values of the local mode gain coefficients, that is, the product of the material gain factors and the optical confinement coefficients in equations (1) and (2) are equal to each other. Consequently, the gains for TM and TE modes of the semiconductor optical amplifier 10 are substantially equal to each other in the whole of the active layer 14. Therefore, the dependence of the amplification property on the polarization direction is reduced in the semiconductor optical amplifier 10. In the general application of the semiconductor optical amplifier 10, the TE and TM modes gain can be considered to be equal if the gain difference between the TE and TM mode is within 1 dB.

The thickness of the active layer 14 is gradually increased in the light propagating direction. Thus, there is no reflection and scattering of the propagating light due to the change of the thickness of the active layer 14 and the light can propagate in the active layer with gradually changing its propagation mode. Consequently, the thickness change of the active layer does not affect the device performance.

Since the cross section, taken perpendicular to the light propagating direction, of the active layer has a line-symmetry in the width direction (the X direction), the profile of the emitted axis beam is a gaussian-shape that has a line-symmetry with respect to the axis of the symmetry on the cross section of the active layer. Thus, the optical coupling between an optical fiber and the semiconductor optical amplifier 10 is easily obtained.

Differing from the case of the conventional semiconductor optical amplifier, the cross section, taken perpendicular to the light propagating direction, of the active layer 14 is not needed to be square to realize a polarization-insensitive amplification characteristics. Therefore, the shape of the active layer can be chosen freely, considering the optical coupling to an optical fiber, amplification characteristics, and so on. Consequently, flexibility in the design of semiconductor optical amplifiers can be greatly increased.

Figure 3:
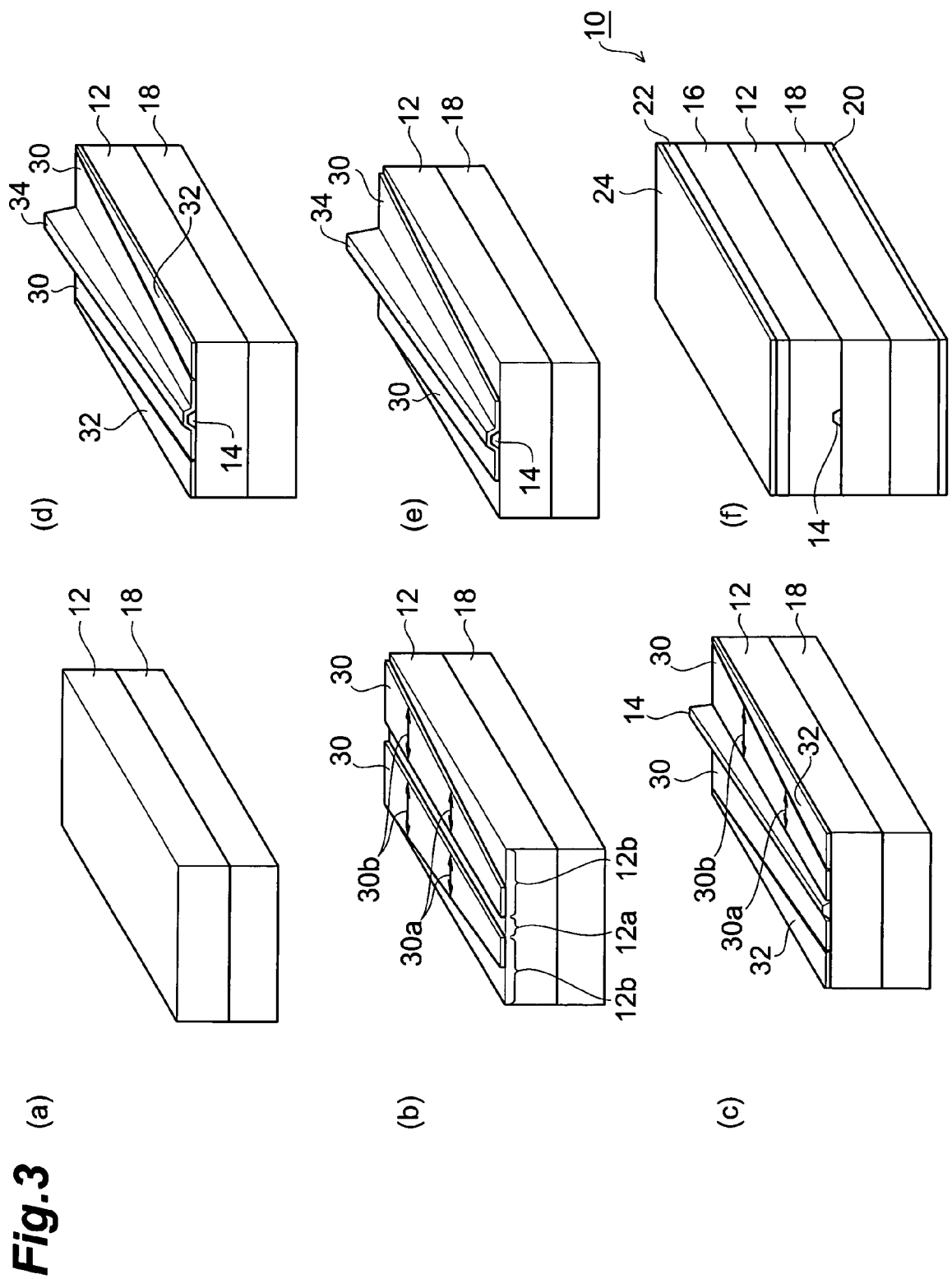
FIG. 3 is a view showing the fabrication of a semiconductor optical amplifier according to the first embodiment of the present invention.

Fabrication of the semiconductor optical amplifier 10 will be described below. FIG. 3 shows the fabrication of a semiconductor optical amplifier according to the first embodiment of the present invention. Parts (a) to (f) of FIG. 3 show the products made in each step in this fabrication method.

In this fabrication, the lower cladding layer 12 is grown on the substrate 18 to form the product shown in part (a) of FIG. 3. The lower cladding layer 12 is grown by organo metallic vapor phase epitaxy (OMVPE, for example).

Next, a mask 30 is formed on the second region 12b of the lower cladding layer 12 to form the product shown in part (b) of FIG. 3. The mask 30 extends along the edges of the first region 12a of the lower cladding layer 12, and the width of the mask 30 is increased in the propagating direction from the one facet toward the other facet. The mask 30 has first portions 30a and second portions 30b. The width of the first portions 30a is smaller than that of the second portions 30b.

Thereafter, the active layer 14 is formed on the first region 12a of the lower cladding layer 12 to form the product shown in part (c) of FIG. 3. The active layer 14 is grown, for example, by OMVPE method. In this growth, a layer 32 made of the same material as the active layer 14 is also grown on regions that the mask 30 does not cover.

In the crystal growth, raw materials fallen on the mask 30 are not deposited thereon and diffuse along the width direction (X direction in FIG. 1) of the mask 30 onto the first region 12a. The diffused materials are first decomposed on the first region 12a and then react one another to grow crystal of the active layer 14. The diffused materials from the first portions 30a is used to grow crystal on one part of the first region 12a and the diffused materials from the second portions 30b is used to grow crystal on another part of the first region 12a. Here, the diffused materials from the second portions 30b are more than those from the first portions 30a, because the width of the portions 30b is larger than that of the first portion 30a, and therefore, in the second portions 30b, more materials can diffuse without being deposited on the mask than in the first portions 30a. Consequently, the growth rate on another part of the first region 12a is greater than that on the one part of the first region 12a. Accordingly, the thickness of the active layer 14 is increased in the light propagating direction from one facet to the other facet depending on the width of the mask 30.

This crystal growth is called as selective crystal growth. The mask 30 for the selective crystal growth is made of material that has heat resistance to high temperature of crystal growth and on which the semiconductor material cannot be grown. For example, SiN or $SiO_2$ is often used for the material of the mask 30, because they have few defects, they can be deposited easily, and they can be patterned with a high accuracy.

Thereafter, a mask 34 is formed on the active layer 14 to form the product shown in part (d) of FIG. 3. Then, the layer 32 is removed from the above product shown in part (d) of FIG. 3 to form the product shown in part (e) of FIG. 3.

After the masks 30 and 34 are removed by etching, the upper cladding layer 16 and the contact layer 22 are grown and the upper electrode 20 and the lower electrode 24 are formed. The antireflection coatings 26a and 26b are deposited to form the product shown in part (f) of FIG. 3. For simplicity, the antireflection coatings 26a and 26b are not shown in part (f) of FIG. 3.

In the above fabrication method, semiconductor crystal is grown by OMVPE method. Alternatively, the semiconductor crystal can be grown by a variety of crystal growth methods, such as MBE (Molecular Beam Epitaxy), LPE (Liquid Phase Epitaxy) and VPE (Vapor Phase Epitaxy).

In the modified fabrication method, a part of the upper cladding layer 16 is grown on the active layer 14, and the mask 34 can be formed on this part of the upper cladding layer 16, which protects the active layer 14 from damages caused in a mask forming process.

By use of the fabrication as described above, the active layer 14 having a mesa shape is formed without using etching. Therefore, no dimensional variations and no processing damages of the active layer by etching are caused.

The dimensional accuracy of the width of the active layer 14 depends on the pattern accuracy of the mask 30 and the mask 30 can be formed by fine patterning apparatuses, such as EB exposure machine and step and repeat exposure machine. Accordingly, the width of the active layer 14 is patterned with a high degree of accuracy, and the uniformity and reproducibility thereof over the surface of the processed wafer is obtained. Besides, the active layer 14 is made by a growth method with a high accuracy, such as, OMVPE, so that the thickness of the active layer 14 can be controlled with a high degree of accuracy, and therefore the high uniformity and the high reproducibility thereof over the surface of the processed wafer can be obtained.

Second Embodiment

Figure 4:
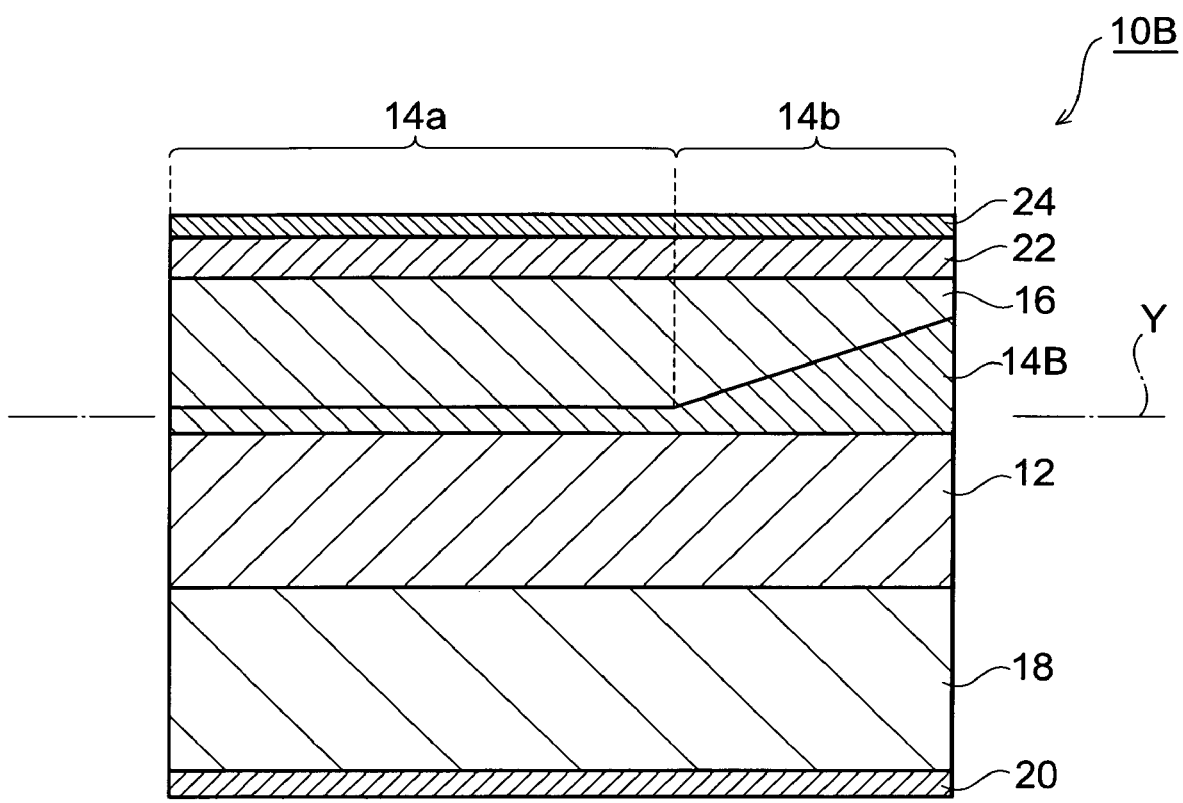
FIG. 4 is a cross sectional view showing the semiconductor optical amplifier according to the second embodiment of the present invention.

FIG. 4 is a view showing a semiconductor optical amplifier according to the second embodiment of the present invention. FIG. 4 shows a vertical cross section taken along the light propagating direction. A semiconductor optical amplifier 10B is different from the semiconductor optical amplifier 10 in the following points.

An active layer 14B of the semiconductor optical amplifier 10B includes a first portion 14a and a second portion 14b provided in the light propagating direction, for example, the Y direction in FIG. 4.

The width of the active layer 14B is constant as with the active layer 14 in the first embodiment. The first portion 14a of the active layer 14B has a constant thickness. The second portion 14b has the same thickness as that of the first portion 14a at the boundary between the first portion 14a and the second portion 14b, and the thickness of the second portion 14b is increased with distance from the boundary. As is the case with the active layer 14, the shapes of the active layer 14B in the thickness direction is controlled such that the TE mode gain and the TM mode gain are substantial equal to each other by the equalization of integration values of the product of the material gain coefficient and optical confinement factors.

As described above, the active layer 14B has the above first portion 14a of the constant thickness and the second portion 14b the thickness of which is increased with distance therefrom, and the TM mode gain and the TE mode gain are equal to each other.

Third Embodiment

Figure 5:
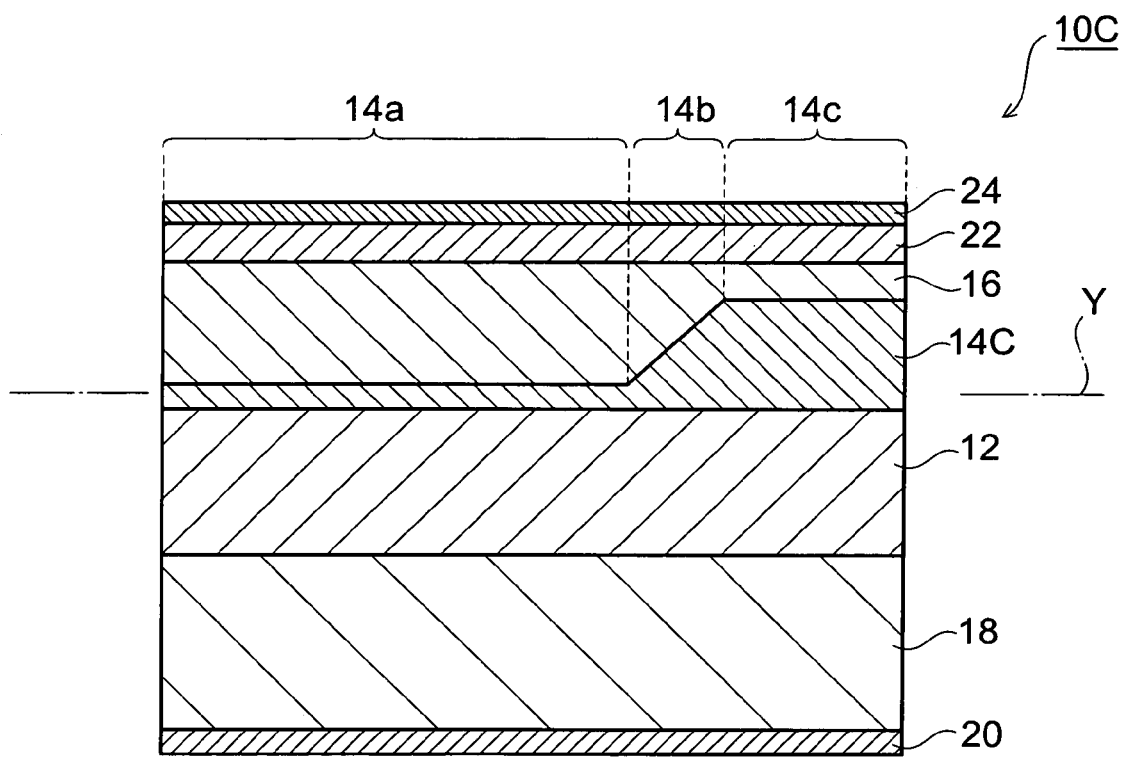
FIG. 5 is a cross sectional view showing the semiconductor optical amplifier according to the third embodiment of the present invention.

FIG. 5 is a view showing a semiconductor optical amplifier according to the third embodiment of the present invention. FIG. 5 shows a vertical cross section taken along the light propagating direction. A semiconductor optical amplifier 10C is different from the semiconductor optical amplifier 10 in the following points.

An active layer 14C of the semiconductor optical amplifier 10C includes a first portion 14a, a second portion 14b and a third portion 14c provided in the light propagating direction, for example, the Y direction in FIG. 5.

The width of the active layer 14C is constant as is the case with the active layer 14B of the second embodiment. The first portion 14a has a constant thickness. The thickness of the second portion 14b at the boundary between the first portion 14a and the second portion 14b is the same as that of the first portion 14a, and is increased with distance from the boundary. The thickness of the third portion 14c at the boundary between the second portion 14b and the third portion 14c is the same as that of the second portion 14b. As is the case with the active layer 14, the shapes of the active layer 14C in the thickness direction is controlled such that the TE mode gain and the TM mode gain are substantial equal to each other by the equalization of integration values of the product of the material gain coefficient and optical confinement factor.

As described above, the active layer 14C has the above first and third portions 14a, 14c of the constant thickness and the second portion 14b the thickness of which is increased with distance from the first portion 14a, and the TM mode gain and the TE mode gain are equal to each other.

Fourth Embodiment

Figure 6:
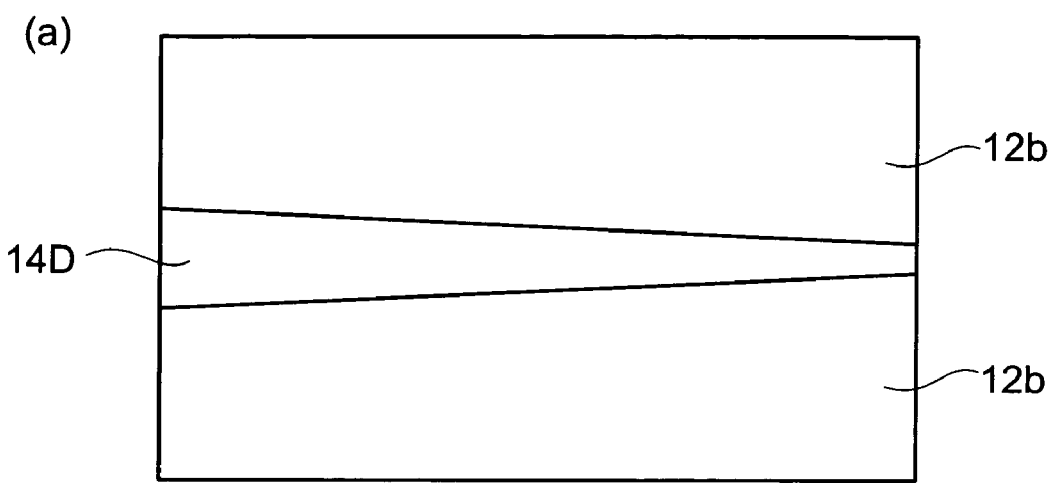
FIG. 6 is a view showing the fabrication of a semiconductor optical amplifier according to the fourth embodiment of the present invention.
Figure 6:
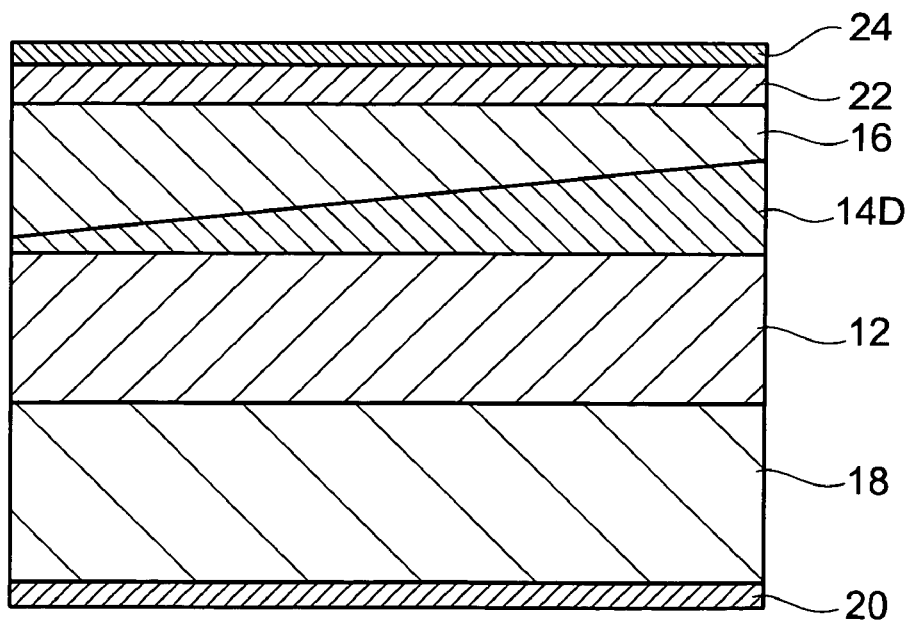

FIG. 6 is a view showing a semiconductor optical amplifier according to the fourth embodiment of the present invention. Part (a) of FIG. 6 is a top view showing an active layer formed on the lower cladding layer. Part (b) of FIG. 6 is a vertical cross section taken along the light propagating direction. A semiconductor optical amplifier 10D is different from the semiconductor optical amplifier 10 in the following points.

Since the active layer 14D of the semiconductor optical amplifier 10D has a thickness that is increased in the light propagating direction from one facet toward another facet as is the case with the active layer 14, the optical confinement factor of the TM mode is increased from one facet toward another facet. On the other hand, the width of the active layer 14D is decreased in a direction from the one facet toward the other facet. Therefore, the optical confinement factor of the TE mode is reduced from one facet toward the another facet. As is the case with the active layer 14, the shapes of the active layer 14D in both of the thickness and width directions are controlled such that the TE mode gain and the TM mode gain are substantial equal to each other by the equalization of integration values of the product of the material gain coefficient and optical confinement factor shown in equations (1) and (2).

It is preferable that not only the thickness but also the width of the active layer are changed in the light propagating directions as shown in the active layer 14D. That is, in the first to third embodiments in which only the thickness of the active layer is changed, the TM mode gain and TE mode gain in the active layer should be substantially equalized to each other by using only the change of the TM mode optical confinement factor due to the thickness change. On the other hand, in the fourth embodiment in which the thickness and width of the active layer are changed, the TM mode gain and TE mode gain in the active layer can be substantially equalized to each other by using the change of the TE mode optical confinement factor due to the width of change in addition to the change of the TM mode optical confinement factor due to the thickness change. In this case, both of the width and thickness changes of the active layer can be used to reduce the dependence of the amplification property on the polarization direction, which increases flexibility in the semiconductor optical amplifier design.

Having described and illustrated preferred embodiments according to the present invention, the present invention is not limited thereto. It is appreciated by those having skill in the art that the invention can be modified in arrangement and detail without departing from such principles.

For example, the strain-free active layer is used in the preferred embodiments according to the present invention, but the active layer with compressive or tensile strain can be also used. The thickness of the active layer having a bulk structure is large, and thus a large strain cannot be applied to the active layer. However, a small strain can be applied thereto without strain-induced defects, such as misfit dislocations, and therefore, a good crystalline quality of the active layer can be maintained. Although the strain-free active layer has no polarization dependence of the material gain as shown in Equation (3), the application of strain into the active layer causes the dependence of the material gain on polarization. With the application of compressive strain, the TE mode material gain is greater than the TM mode material gain ($g_{TE}(y) > g_{TM}(y)$), and with the application of tensile strain, the TE mode material gain is smaller than the TM mode material gain ($g_{TE}(y) < g_{TM}(y)$). Consequently, when the strained bulk active layer is used, the polarization dependence of the material gain that changes according to the type and the quantity of the applied strain as well as the polarization dependence of the optical confinement factor can be used in the above equalization of the TE mode gain with the TE mode gain. Thus, the flexibility in the design is increased and the optimization of the structure can be easily performed. If the active layer is made of material of a lattice constant greater than that of the substrate, compressive strain is applied to the active layer, and if the active layer is made of material of a lattice constant smaller than that of the substrate, tensile strain is applied to the active layer.

Although the active layer has a bulk structure in the above embodiments, the active layer may have a quantum well structure, such as a single quantum well structure and a multiple quantum well structure. In this case, the TE mode material gain is greater than the TM mode material gain if the quantum well structure is strain-free or compressively-strained and the TE mode material gain is smaller than the TM mode material gain if it is tensile-strained. Therefore, if the active layer consists of a quantum well structure, the polarization dependence of the material gain as well as the polarization dependence of the optical confinement factor can be used for the above equalization of gains between the TE and TM modes, as is the case with the strained bulk active layer. Thus, the flexibility in the design is increased and the optimization of the structure can be easily performed.

Although the semiconductor optical amplifier uses the structure that confines current into the mesa-shaped active layer by use of the bandgap difference between the active layer and the upper and lower cladding layers, any kind of current confinement structure can be also used for the semiconductor optical amplifier. For example, the semiconductor optical amplifier may use a ridge stripe structure including a ridge-shaped upper cladding layer and a insulating film provided on both sides of the ridge-shaped upper cladding layer for current confinement. Furthermore, the semiconductor optical amplifier can use a buried ridge stripe structure in which not insulating films but semiconductor current blocking layers are grown on both sides of the ridge-shaped upper cladding layer for current confinement. Furthermore, the semiconductor optical amplifier can use a buried heterostructure (BH) and so on.

Although a GaAs substrate is used as a base for crystal growth in the embodiments, a hetero-structure in which a GaAs semiconductor layer is grown on a different kind of substrate, such as a silicon substrate can be also used as the base. Such hetero-substrates increase design flexibility and permit the integration of optical devices and electron devices which are fabricated on different substrates.

In the present embodiment, a mask is formed on the lower cladding layer and this mask is used for selective crystal growth. Similar selective crystal growth can be also performed by use of a mask formed on the substrate or any layer below the active layer.

Having described and illustrated the embodiments of the semiconductor optical amplifiers according to the invention, the application of the present invention is not limited thereto. The invention is applicable to the following: light emitting diodes, semiconductor lasers, electro-absorption semiconductor modulators, Mach-Zehnder type optical modulators, optical wave-guides and the integration device of the above. The application of the present invention provides semiconductor optical devices that can improve the yield, reproducibility, uniformity, and reliability and reduce the dependence of amplification property of polarization direction. Details of structures of these devices can be modified as necessary. We therefore claim all modifications and variations coming within the spirit and scope of the following claims.

What is claimed is:

1. A semiconductor optical device comprising:
   one facet of the semiconductor optical device and another facet of the semiconductor optical device opposite the one facet;
   a lower cladding layer of a first conductive type, the lower cladding layer having a first region and a second region, the first region extending in a direction of a predetermined axis, and the second region being adjacent to the first region;
   an upper cladding layer of a second conductive type; and
   an active layer provided between the first region of the lower cladding layer and the upper cladding layer, a thickness of the active layer continuously increasing in a direction from the one facet of the semiconductor optical device to the another facet of the semiconductor optical device, the opposing facets being located at longitudinal ends of the active layer, the active layer having TM mode gain and TE mode gain, with the TM mode gain and TE mode gain being substantially equal to each other.

2. A semiconductor optical device comprising:
   one facet of the semiconductor optical device and another facet of the semiconductor optical device opposite the one facet;
   a lower cladding layer of a first conductive type, the lower cladding layer having a first region and a second region, the first region extending in a direction of a predetermined axis, and the second region being adjacent to the first region;
   an upper cladding layer of a second conductive type; and
   an active layer provided between the first region of the lower cladding layer and the upper cladding layer, a thickness of the active layer continuously increasing in a direction from the one facet of the semiconductor optical device to the another facet of the semiconductor optical device, the opposing facets being located at longitudinal ends of the active layer, the active layer having TM mode gain and TE mode gain, with the TM mode gain and TE mode gain being substantially equal to each other.

3. The semiconductor optical device according to claim 1, wherein the active layer has tensile strain.

4. The semiconductor optical device according to claim 1, wherein the active layer has compressive strain.

5. The semiconductor optical device according to claim 1, wherein the upper cladding layer is provided on the second region of the lower cladding layer and the active layer.

6. The semiconductor optical device according to claim 1, wherein the upper cladding layer and the second region of the lower cladding layer forms a pn junction.

7. The semiconductor optical device according to claim 6, wherein the active layer, the upper cladding layer and the second region of the lower cladding layer form a pin junction, and a built-in potential of the pin junction is smaller than that of the pn junction.

8. The semiconductor optical device according to claim 1, wherein the active layer has a bulk structure.

9. The semiconductor optical device according to claim 1, wherein the active layer has a quantum well structure.

10. The semiconductor optical device according to claim 1, wherein the semiconductor optical device includes a semiconductor laser.

11. The semiconductor optical device according to claim 1, wherein the semiconductor optical device includes a light emitting diode.

12. The semiconductor optical device according to claim 1, wherein the semiconductor optical device includes a semiconductor optical amplifier.

13. The semiconductor optical device according to claim 1, wherein the semiconductor optical device includes an electro-absorption type modulator.

14. The semiconductor optical device according to claim 1, wherein the semiconductor optical device includes a semiconductor optical waveguide.

15. The semiconductor optical device according to claim 1, wherein the semiconductor optical device includes a Mach-Zehnder type optical modulator.

16. The semiconductor optical device according to claim 1, wherein a width of the active layer is larger than the thickness at the one facet, and the thickness is larger than the width at the another facet.

17. The semiconductor optical device according to claim 2, wherein the width of the active layer is larger than a thickness at the one facet, and the thickness is larger than the width at the another facet.

18. The semiconductor optical device according to claim 1, wherein the thickness of the active layer increases in the direction, and a width of the active layer decreases in the direction.

19. The semiconductor optical device according to claim 1, wherein a width of the active layer is continuously changed in the direction.

20. The semiconductor optical device according to claim 1, wherein the direction from the one facet to the another facet is the direction of light propagation in the device.

21. The semiconductor optical device according to claim 2, wherein the direction from the one facet to the another facet is the direction of light propagation in the device.

* * * * *